(12) United States Patent
Liaw

(10) Patent No.: US 10,818,676 B2
(45) Date of Patent: Oct. 27, 2020

(54) FINFET SRAM HAVING DISCONTINUOUS PMOS FIN LINES

(71) Applicant: Taiwan Semiconductor Manufacturing Co., Ltd., Hsin-Chu (TW)

(72) Inventor: Jhon Jhy Liaw, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/692,422

(22) Filed: Nov. 22, 2019

(65) Prior Publication Data

US 2020/0091159 A1     Mar. 19, 2020

Related U.S. Application Data

(63) Continuation of application No. 16/101,728, filed on Aug. 13, 2018, now Pat. No. 10,490,560, which is a
(Continued)

(51) Int. Cl.
*H01L 27/11*     (2006.01)
*H01L 21/8238*     (2006.01)
(Continued)

(52) U.S. Cl.
CPC ........ *H01L 27/1104* (2013.01); *G11C 11/412* (2013.01); *H01L 21/823807* (2013.01); *H01L 21/823821* (2013.01); *H01L 21/823842* (2013.01); *H01L 21/823878* (2013.01); *H01L 23/5286* (2013.01); *H01L 27/0924* (2013.01); *H01L 27/1116* (2013.01); *H01L 29/1054* (2013.01); *H01L 29/161* (2013.01);
(Continued)

(58) Field of Classification Search
CPC ............. H01L 27/1104; H01L 27/0924; H01L 27/1116; H01L 27/0605; H01L 21/823807; H01L 21/823821; H01L 21/823842; H01L 21/823878; H01L 23/5286; H01L 29/1054; H01L 29/161; H01L 29/4966; H01L 29/785; G11C 11/412
USPC ....................................................... 257/369
See application file for complete search history.

(56) References Cited

U.S. PATENT DOCUMENTS 8,198,655 B1   6/2012   Pileggi et al.
8,399,931 B2   3/2013   Liaw et al.
(Continued)

FOREIGN PATENT DOCUMENTS

DE    102010024480 A1    7/2011
JP    2009130210 A    6/2009
(Continued)

*Primary Examiner* — Tu-Tu V Ho
(74) *Attorney, Agent, or Firm* — Haynes and Boone, LLP

(57) ABSTRACT

An IC chip includes a logic circuit cells array and a static random access memory (SRAM) cells array. The logic circuit cells array includes a plurality of logic circuit cells abutted to one another in a first direction. The logic circuit cells array includes one or more continuous first fin lines that each extends across at least three of the abutted logic circuit cells in the first direction. The static random access memory (SRAM) cells array includes a plurality of SRAM cells abutted to one another in the first direction. The SRAM cells array includes discontinuous second fin lines.

20 Claims, 17 Drawing Sheets

900

```
Forming one or more continuous first fin lines in a logic circuit cells
array that includes a plurality of logic circuit cells abutted to one
another in a first direction, wherein the one or more continuous first fin
lines are formed such that they each extend across at least three of the
abutted logic circuit cells in the first direction
```
⟶ 910

```
Forming discontinuous second fin lines in a static random access
memory (SRAM) cells array that includes a plurality of SRAM cells
abutted to one another in the first direction, wherein the discontinuous
second fin lines each extends into no more than two of the abutted
SRAM cells
```
⟶ 920

Related U.S. Application Data continuation of application No. 15/492,777, filed on Apr. 20, 2017, now Pat. No. 10,056,390.

(51) Int. Cl.
    *H01L 27/092* (2006.01)
    *H01L 29/161* (2006.01)
    *H01L 29/10* (2006.01)
    *H01L 29/49* (2006.01)
    *G11C 11/412* (2006.01)
    *H01L 29/78* (2006.01)
    *H01L 23/528* (2006.01)
    *H01L 27/06* (2006.01)

(52) U.S. Cl.
    CPC ........ *H01L 29/4966* (2013.01); *H01L 29/785* (2013.01); *H01L 27/0605* (2013.01)

(56) References Cited

U.S. PATENT DOCUMENTS

| | | | |
|---|---|---|---|
| 8,605,523 B2 | 12/2013 | Tao et al. | |
| 8,630,132 B2 | 1/2014 | Cheng et al. | |
| 8,653,630 B2 | 2/2014 | Liaw et al. | |
| 8,760,948 B2 | 6/2014 | Tao et al. | |
| 8,937,358 B2 | 1/2015 | Yang et al. | |
| 9,496,269 B1 * | 11/2016 | Liaw | H01L 29/6681 |
| 2007/0221956 A1 | 9/2007 | Inaba | |
| 2011/0075470 A1 | 3/2011 | Liaw | |
| 2011/0278676 A1 | 11/2011 | Cheng et al. | |
| 2013/0292777 A1 | 11/2013 | Liaw | |
| 2014/0032871 A1 | 1/2014 | Hsu et al. | |
| 2014/0153321 A1 | 6/2014 | Liaw | |
| 2014/0153345 A1 | 6/2014 | Kim et al. | |
| 2014/0177352 A1 | 6/2014 | Lum | |
| 2014/0233330 A1 | 8/2014 | Ko et al. | |
| 2014/0241077 A1 | 8/2014 | Katoch et al. | |
| 2014/0269114 A1 | 9/2014 | Yang et al. | |
| 2015/0243667 A1 | 8/2015 | Liaw | |
| 2016/0260719 A1 | 9/2016 | Chung | |
| 2016/0372182 A1 | 12/2016 | Liaw | |

FOREIGN PATENT DOCUMENTS

| | | |
|---|---|---|
| KR | 2014010709 A | 9/2014 |
| KR | 20140111928 A | 9/2014 |
| TW | 201539718 A | 10/2015 |

* cited by examiner

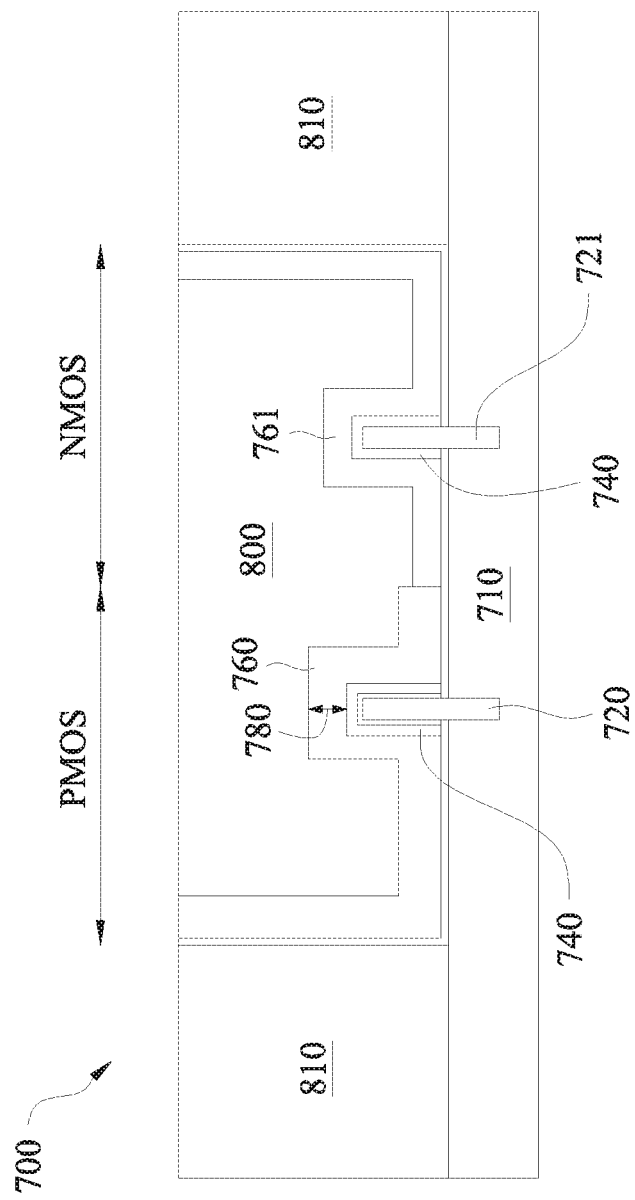

FINFET SRAM HAVING DISCONTINUOUS PMOS FIN LINES

PRIORITY DATA

This application is a continuation of U.S. application Ser. No. 16/101,728, filed Aug. 13, 2018, which is a continuation of U.S. application Ser. No. 15/492,777, filed Apr. 20, 2017, now U.S. patent Ser. No. 10/056,390, issued Aug. 21, 2018, which are herein incorporated by reference in their entirety.

BACKGROUND

In deep sub-micron integrated circuit technology, an embedded static random access memory (SRAM) device has become a popular storage unit of high speed communication, image processing and system-on-chip (SOC) products. The amount of embedded SRAM in microprocessors and SOCs increases to meet the performance requirement in each new technology generation. As silicon technology continues to scale from one generation to the next, the impact of intrinsic threshold voltage (Vt) variations in minimum geometry size bulk planar transistors reduces the complimentary metal-oxide-semiconductor (CMOS) SRAM cell static noise margin (SNM). This reduction in SNM caused by increasingly smaller transistor geometries is undesirable. SNM is further reduced when Vcc is scaled to a lower voltage.

To solve SRAM issues and to improve cell shrink capability, fin field effect transistor (FinFET) devices are often considered for some applications. The FinFET provides both speed and device stability. The FinFET has a channel (referred to as a fin channel) associated with a top surface and opposite sidewalls. Benefits can be derived from the additional sidewall device width ($I_{on}$ performance) as well as better short channel control (sub-threshold leakage). Therefore, FinFETs are expected to have advantages in terms of gate length scaling and intrinsic $V_t$ fluctuation. However, existing FinFET SRAM devices still have shortcomings, for example shortcomings related to cell write margins or chip speeds.

Therefore, although existing FinFET SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 9A is a diagrammatic fragmentary cross-sectional side view of a portion of a CMOSFET device in a standard cell according to embodiments of the present disclosure.

DETAILED DESCRIPTION

Figure 1A:
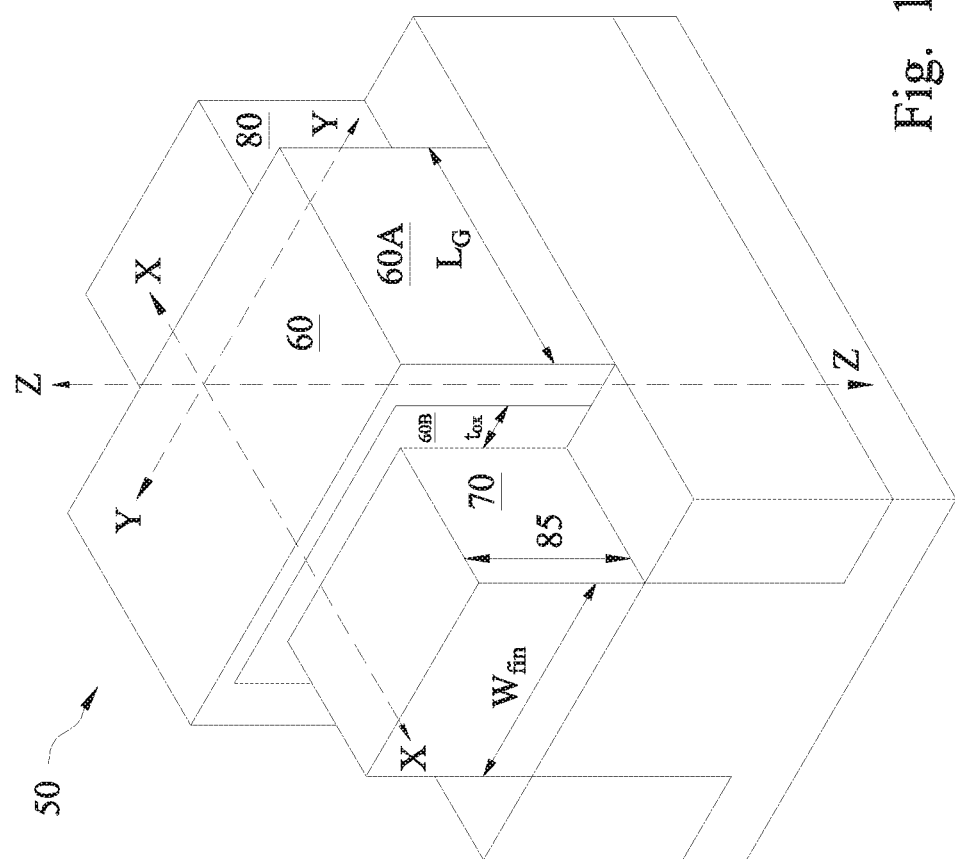
FIG. 1A is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device.

The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1A, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1A. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 1B:
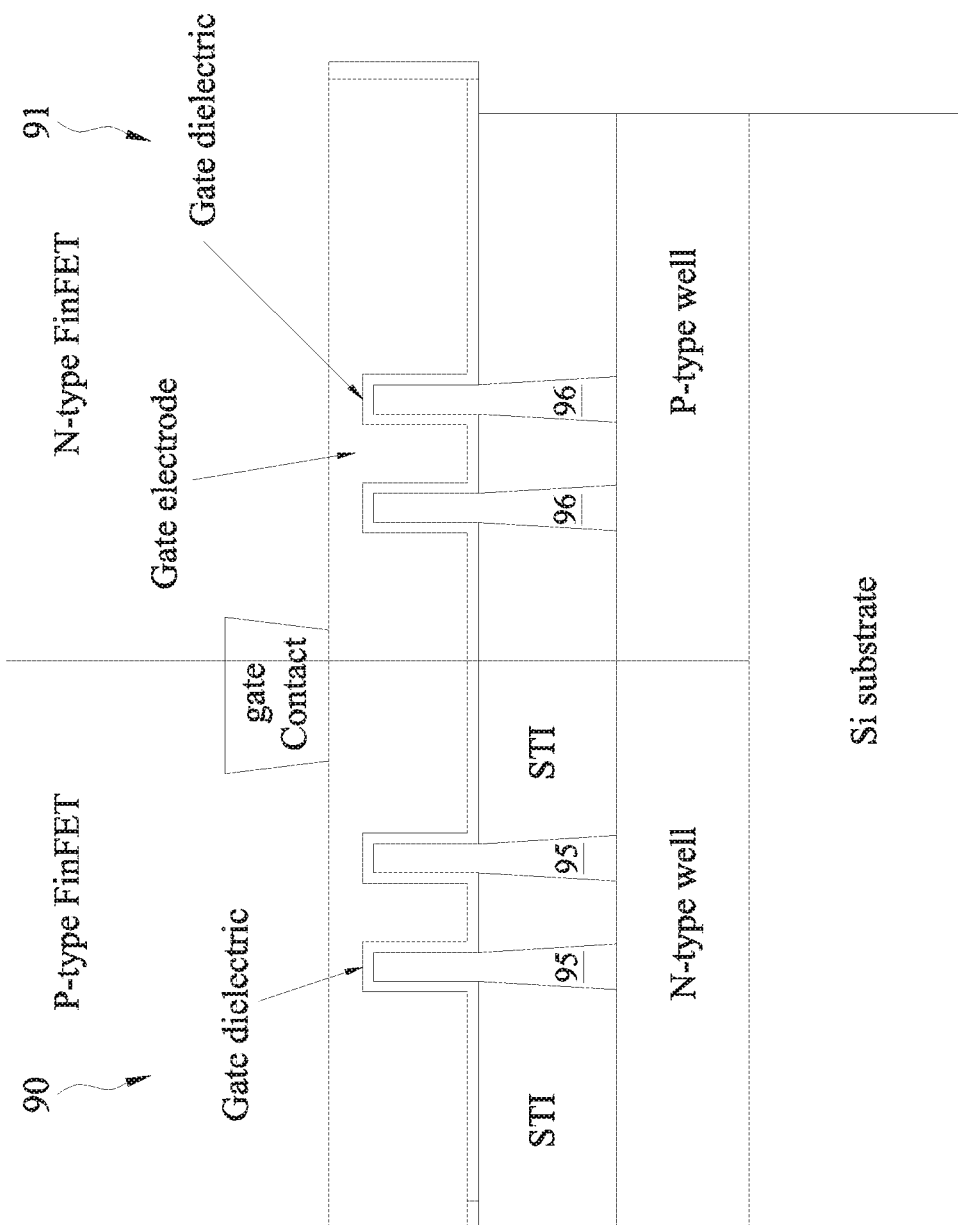
FIG. 1B illustrates a diagrammatic cross-sectional side view of FinFET transistors in a CMOS configuration.

FIG. 1B illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate contact is formed on the gate electrode to provide electrical connectivity to the gate.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, traditional FinFET fabrication methods may still have shortcomings, such as lack of optimization for embedded SRAM manufacturing. For example, traditional FinFET fabrication may face concerns related to SRAM cell write margin and logic circuit speeds. The present disclosure describe FinFET logic circuit and SRAM cells that have improved SRAM cell write margin without reducing the logic circuit speeds, as discussed in more detail below.

Figure 2:
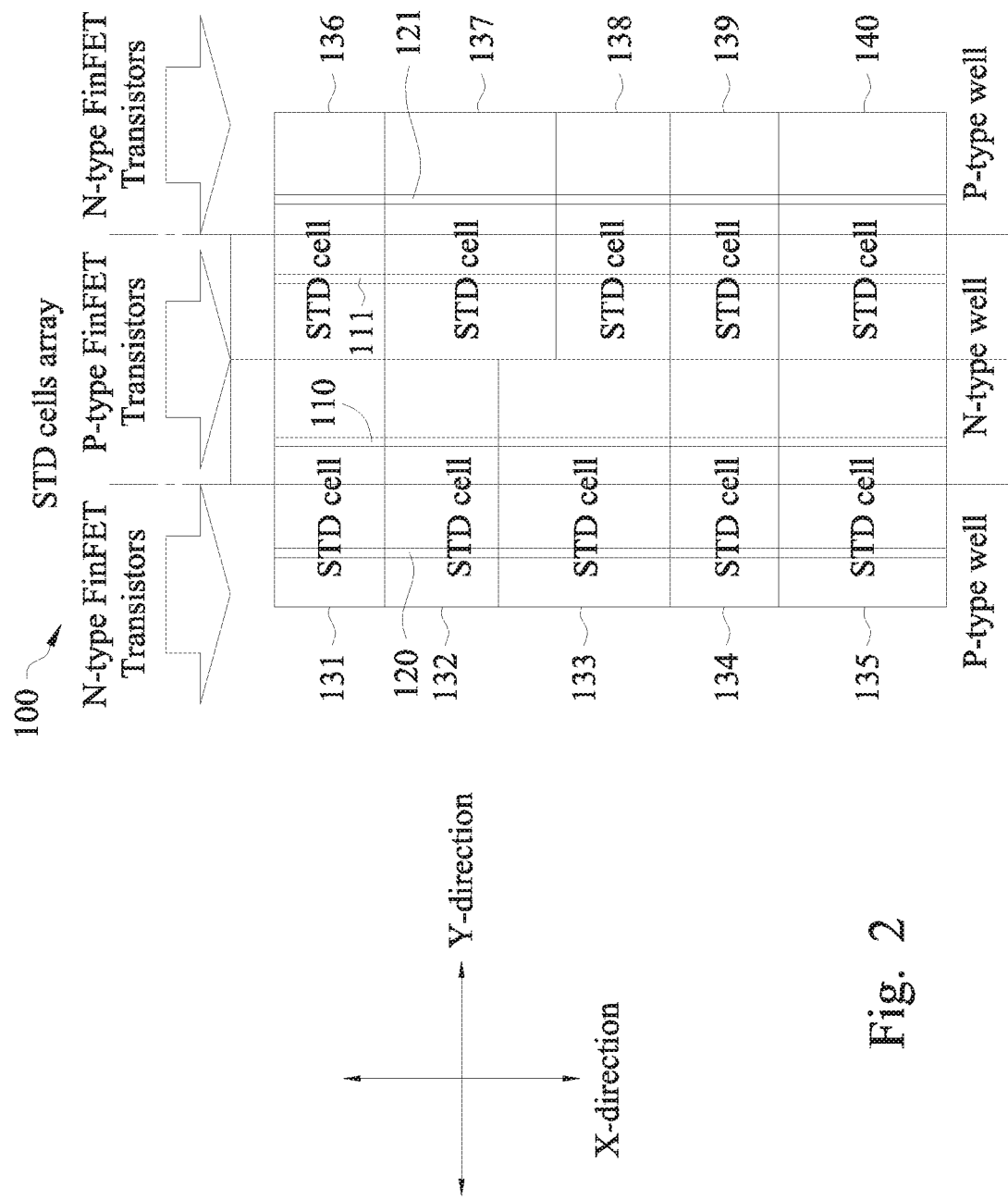
FIG. 2 illustrates a top view of a standard (STD) cells array according to embodiments of the present disclosure.

FIG. 2 illustrates a top view of a standard (STD) cells array 100 according to embodiments of the present disclosure. The standard cells array 100 may include logic circuits or logic devices, and as such it is also referred to as a logic cells array or a logic circuit array. In various embodiments, the logic circuits or devices may include components such as inverters, NAND gates, NOR gates, flip-flops, or combinations thereof.

As illustrated in FIG. 2, the standard cells array 100 includes N-type FinFET transistors with a P-type well, as well as P-type FinFET transistors with an N-type well. The standard cells array 100 also includes a plurality of elongated fin lines, for example fin lines 110-111 as parts of the P-type FinFET transistors, as well as fin lines 120-121 as parts of the N-type FinFET transistors. The P-type FinFET fin lines 110-111 are located over the N-type wells, whereas the N-type FinFET fin lines 120-121 are located over the P-type wells.

As an example, the standard cells array 100 shown herein includes 10 standard cells 131 through 140, where the cells 131 through 135 are arranged into a first column, and the cells 136 through 140 are arranged into a second column adjacent to the first column. Of course, FIG. 2 merely illustrates an example of the standard cells array 100, and other embodiments may have different numbers of cells and/or may be arranged differently.

As shown in FIG. 2, the fin lines 110-111 and 120-121 each extend through a respective column of the standard cells (e.g., fin lines 110 and 120 extending through the standard cells 1-5, and fin lines 111 and 121 extending through the standard cells 6-10) in the X-direction (X-direction of FIG. 1A). Thus, the fin lines 110-111 and 120-121 may each be considered "continuous."

As discussed above with reference to FIG. 1A, the fin lines 110-111 and 120-121 each include a channel region as well as source/drain regions located next to (e.g., on opposite sides of) the channel region. The FinFET transistors of the STD cells array 100 each include a respective gate electrode that wraps around a respective one of the fin lines 110-111 or 120-121 in the manner described above with reference to FIG. 1A. In the present embodiments, the P-type FinFET (PMOSFET) fin lines 110-111 are comprised of a silicon germanium (SiGe) material (for enhancing the strain effect), but the N-type FinFET (NMOSFET) fin lines 120-121 are comprised of a non-germanium-containing semiconductor material, for example silicon (Si). Therefore, in some embodiments, the PMOSFET has a SiGe channel, but the NMOSFET has a Si channel. In some embodiments, a channel fin width of the NMOSFET is narrower than a channel fin width of the PMOSFET. In some embodiments, the source/drain regions of the NMOSFET includes an epi-material selected from the group consisting of: SiP, SiC, SiPC, SiAs, Si, or combinations thereof. In some embodiments, the PMOSFET's source/drain region has a wider width than the channel region.

In some embodiments, for the PMOSFET, the germanium atomic concentration in the SiGe channel region is less than the germanium atomic concentration in the source/drain region. For example, the germanium atomic concentration in the SiGe channel region may be in a range between about 10% and about 40%, and the germanium atomic concentration in the source/drain region may be in a range between about 30% and about 75% in some embodiments.

In some embodiments, for the PMOSFET, the SiGe channel fin width is smaller than the SiGe channel sidewall depth. For example, the SiGe channel fin width for the PMOSFET may be in a range between about 3 nanometers (nm) and about 10 nm, and the SiGe channel sidewall depth (labeled in FIG. 1A as channel sidewall depth 85) may be in a range between about 30 nm and about 90 nm in some embodiments.

As discussed above, each of the fin lines 110-111 and 120-121 of the standard cells array 100 is continuous. For example, the fin lines 110-111 and 120-121 each extend across at least three abutted cells (e.g., cells abutted in the X-direction). In the embodiment shown in FIG. 2, the fin lines 110 and 120 each extend across five abutted standard cells 1-5, and the fin lines 111 and 121 each extend across five other abutted standard cells 6-10.

Figure 3:
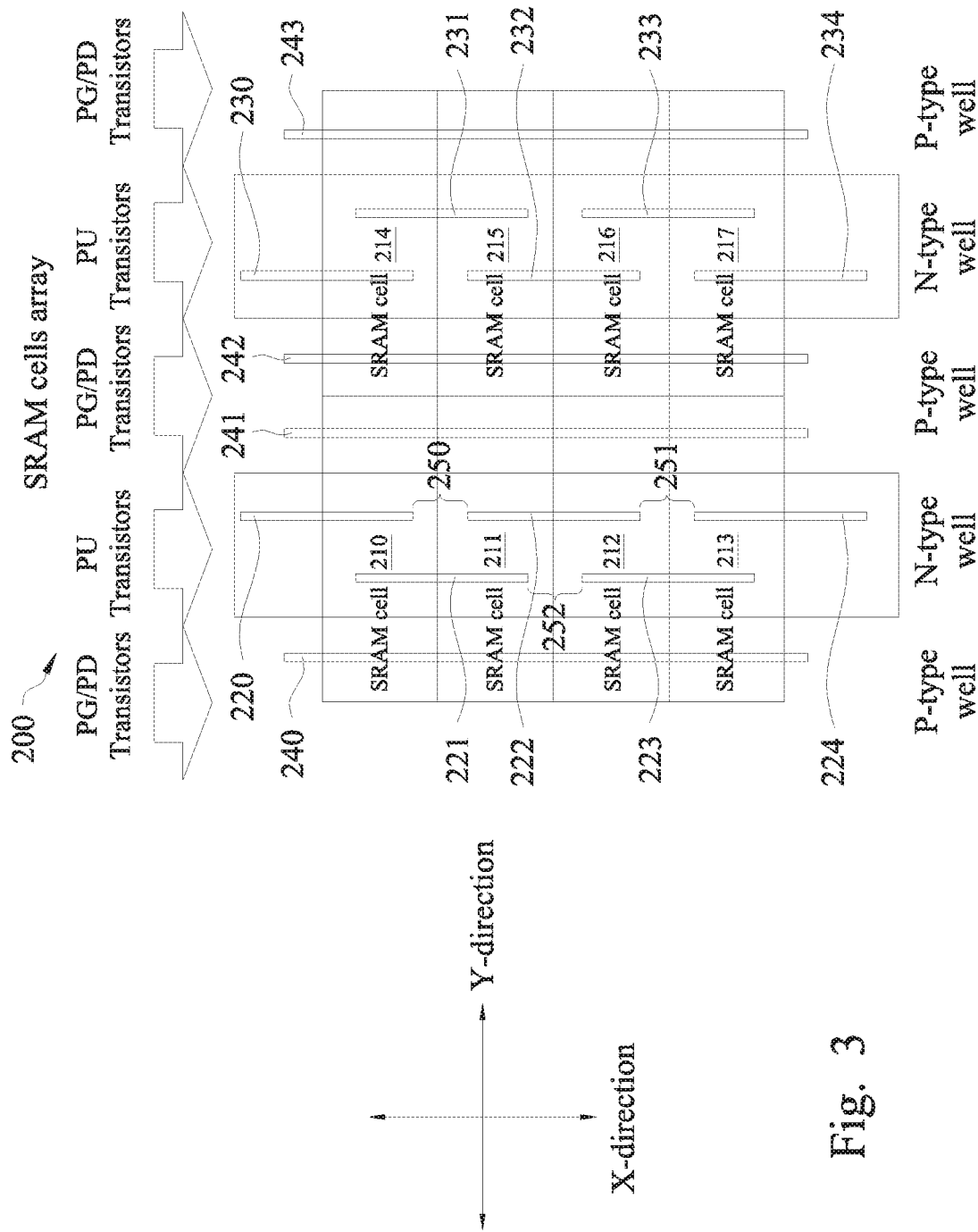
FIG. 3 illustrates a top view of an SRAM cells array according to embodiments of the present disclosure.

Referring now to FIG. 3, a top view of an SRAM cells array 200 is illustrated according to embodiments of the present disclosure. The SRAM cells array 200 includes SRAM cells, for example SRAM cells 210-217. In the illustrated embodiment, the SRAM cells 210-213 are arranged into a first column extending in the X-direction (of FIG. 1A), and the SRAM cells 214-217 are arranged into a second column also extending in the X-direction, where the first column is disposed adjacent to the second column in the Y-direction (of FIG. 1A). Each of the SRAM cells 210-217 comprises two pull-up (PU) transistors, two pass-gate (PG) transistors, and two pull-down (PD) transistors, which may be implemented as FinFETs.

The SRAM cells array 200 includes a plurality of elongated fin lines, for example the fin lines 220-224 and 230-234 as parts of the P-type FinFET transistors in the pull-up (PU) portion of the SRAM cells array 200, as well as fin lines 240-243 as parts of the N-type FinFET transistors in the pass-gate (PG) and pull-down (PD) portions of the SRAM cells array 200. The P-type fin FinFET lines 220-224 and 230-234 are located over the N-type wells, whereas the N-type FinFET fin lines 240-243 are located over the P-type wells.

The fin lines 220-224, 230-234, and 240-243 each extend into one or more of respective SRAM cells in the X-direction. For example, the N-type FinFET fin lines 240-241 each extend continuously across the SRAM cells 210-213, and the N-type FinFET fin lines 242-243 each extend continuously across the SRAM cells 214-217. In comparison, the P-type FinFET fin lines 220-224 and 230-234 are "discontinuous" or "disjointed with one another." For example, the P-type FinFET fin line 220 extends partially into the SRAM cell 210, the fin line 221 extends partially into the SRAM cells 210-211, the fin line 222 extends partially into the SRAM cells 211-212, the fin line 223 extends partially into the SRAM cells 212-213, and the fin line 224 extends partially into the SRAM cell 213. The fin line 221 overlaps with the fin lines 220 and 222 in the X-direction but is spaced apart from the fin lines 220 and 222 in the Y-direction. Likewise, the fin line 223 overlaps with the fin lines 222 and 224 in the X-direction but is spaced apart from the fin lines 222 and 224 in the Y-direction.

In the adjacent column of cells 214-217, the P-type FinFET fin line 230 extends partially into the SRAM cell 214, the fin line 231 extends partially into the SRAM cells 214-215, the fin line 232 extends partially into the SRAM cells 215-216, the fin line 233 extends partially into the SRAM cells 216-217, and the fin line 234 extends partially into the SRAM cell 217. The fin line 231 overlaps with the fin lines 230 and 232 in the X-direction but is spaced apart from the fin lines 230 and 232 in the Y-direction. Likewise, the fin line 233 overlaps with the fin lines 232 and 234 in the X-direction but is spaced apart from the fin lines 232 and 234 in the Y-direction.

As discussed above with reference to FIG. 1A, the fin lines 220-224, 230-234 and 240-243 each include a channel region as well as source/drain regions located next to (e.g., on opposite sides of) the channel region. The FinFET transistors each include a gate electrode that wraps around a respective one of the fin lines 220-224, 230-234, and 240-243 in the manner described above with reference to FIG. 1A. In the present embodiments, the P-type FinFET fin lines 220-224 and 230-234 are comprised of a silicon germanium (SiGe) material (for strain effect enhancement), but the N-type FinFET fin lines 240-243 are comprised of a non-germanium-containing material, for example Si.

It can be seen that, whereas both the fin lines 110-111 for the P-type FinFETs and the fine lines 120-121 for the N-type FinFETs in the standard cells array 100 shown in FIG. 2 are each continuous, and the fin lines 240-243 for the N-type FinFETs in the SRAM cells array 200 shown in FIG. 3 are continuous, the fin lines 220-224 and 230-234 for the P-type FinFETs in the SRAM cells array 200 are "discontinuous." For example, the P-type FinFET fin lines 220-224 could have been implemented as a single continuous fin line (e.g., similar to the N-type FinFET fin line 240) spanning across the SRAM cells 210-213, but according to the various aspects of the present disclosure, that hypothetical single fin line is broken up into five discrete and separate fin lines 220, 221, 222, 223, and 224. The fin lines 220 and 222 are separated by a gap 250 that spans across the boundary between the SRAM cells 210-211 (in the X-direction), and the fin lines 222 and 224 are separated by a gap 251 that spans across the boundary between the SRAM cells 212-213 (in the X-direction). The fin lines 221 and 223 are separated by a gap 252 that spans across the boundary between SRAM cells 211-212 (in the X-direction). Due at least in part to these gaps 250-252, it may be said that the P-type FinFETs in the SRAM cells 200 have discontinuous or broken-up fin lines.

The fin lines 230-234 in the SRAM cells 214-217 are arranged (i.e., broken up into discontinuous fin lines) in a similar manner as the fin lines 230-234. Thus, although each of the fin lines 220-224 and 230-234 extend partially across two adjacent SRAM cells, it may be said that the SRAM cells array 200 has an overall "discontinuous" fin line shape for its P-type FinFETs, which is not the case for the standard cells array 100 or for the N-type FinFETs of the SRAM cells array 200. In some embodiments, the end of each "discontinuous" fin line is located under a gate electrode of another CMOSFET. In some embodiments, the discontinuous or disjointed fin lines 220-224 and 230-234 each extends into no more than two adjacently disposed SRAM cells.

The reason that the fin lines for the standard cells array 100 are continuous but the fin lines (for P-type FinFET) for the SRAM cells array 200 are discontinuous is due to the $I_{on}$ (on current) concerns. If the P-type FinFET devices for the SRAM cells have continuous fin lines, the $I_{on}$ current would be too high, which is not good for SRAM write margins.

According to the present disclosure, the P-type FinFET fin lines for the SRAM cells array 200 are "broken up" or configured in a "discontinuous" manner. This destroys or reduces the strain effect (for the SiGe-strained channels). Consequently, the $I_{on}$ current is reduced for the P-type FinFET fin lines of the SRAM cells array 200, thereby relaxing the SRAM writing margin concerns. Meanwhile, the continuous fin lines are good for logic circuit speeds. The continuous fin lines also solve problems related to line-end shrinkage control problems PMOSFET layout dependent effects for logic circuits. As such, the logic cells (or STD cells) are configured to have continuous fin lines.

Figure 4:
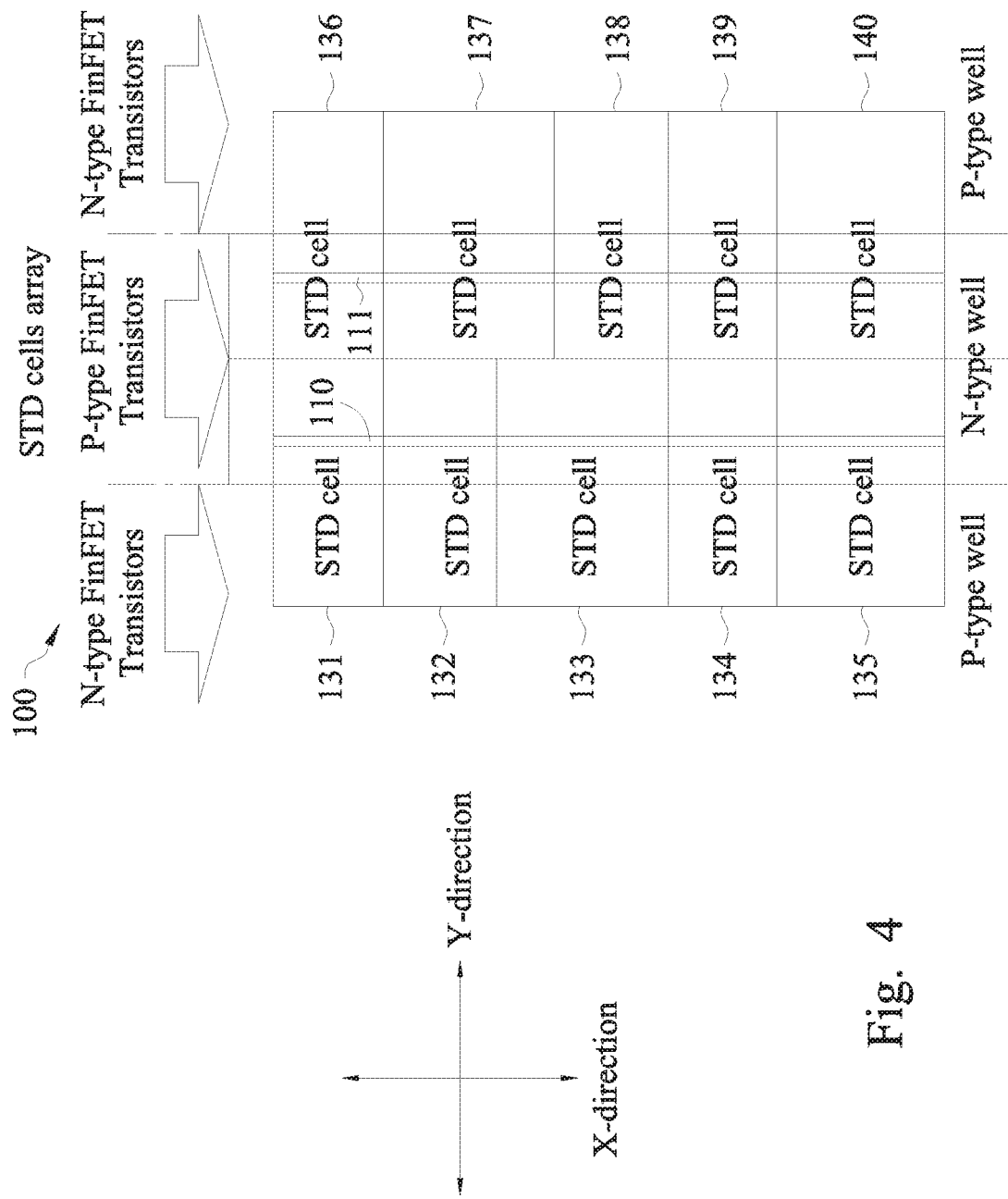
FIG. 4 illustrates a top view of a standard (STD) cells array according to embodiments of the present disclosure.
Figure 5:
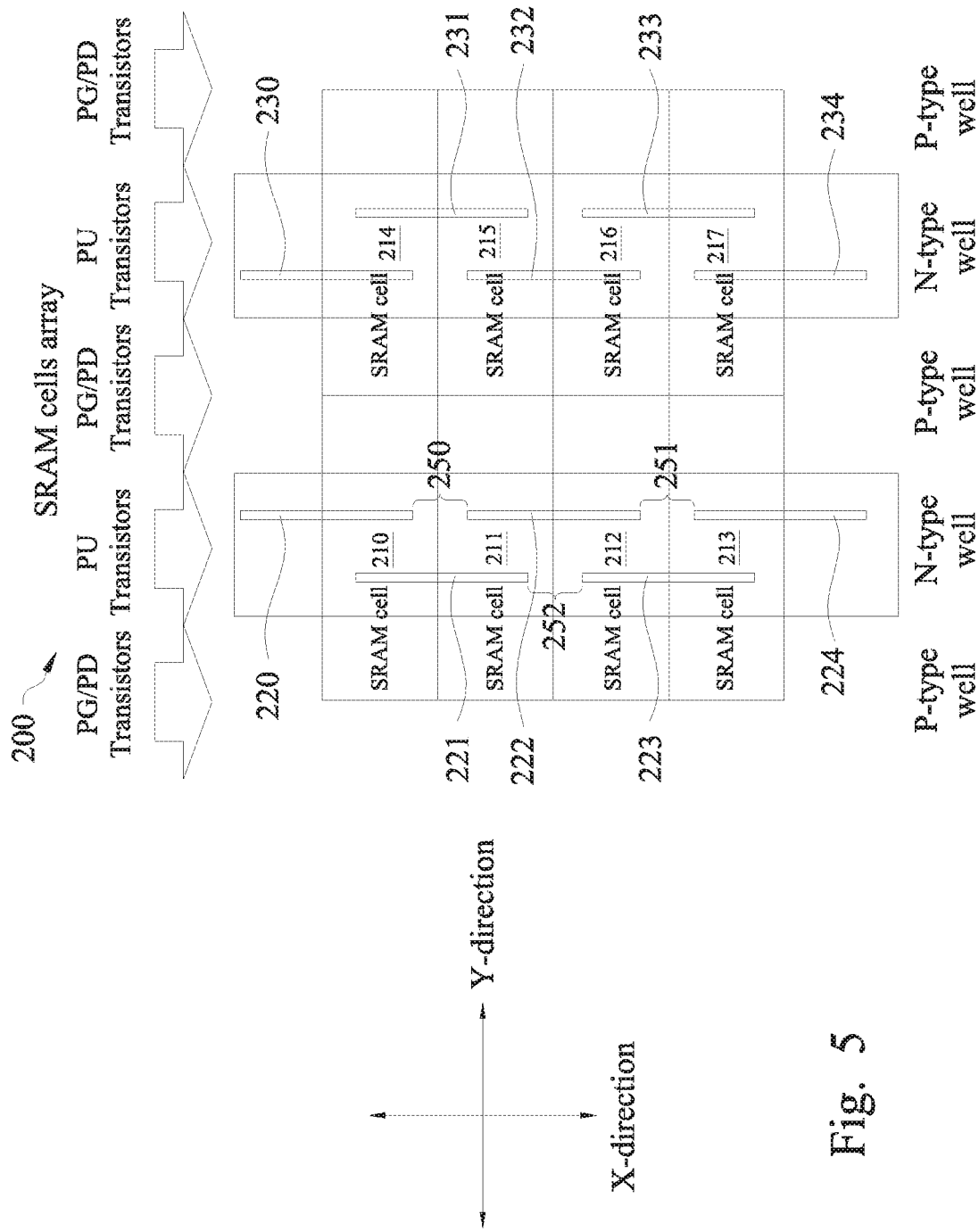
FIG. 5 illustrates a top view of an SRAM cells array according to embodiments of the present disclosure.

FIGS. 4-5 illustrate another embodiment of the STD cells array 100 and the SRAM cells array 200, respectively. The embodiment of the STD cells array 100 and the SRAM cells array 200 are similar to the embodiment shown in FIGS. 2-3, and thus the similar elements appearing in both embodiments are labeled the same herein. However, the embodiment of the STD cells array 100 shown in FIG. 4 does not have the N-type FinFET fin lines 120-121, and the embodiment of the SRAM cells array 200 shown in FIG. 5 does not have the N-type FinFET fin lines 240-243. Nevertheless, the embodiment of the SRAM cells array 200 shown in FIG. 5 still has discontinuous or broken fin lines for its P-type FinFETs for the same reasons (e.g., $I_{on}$ current) as discussed above.

Figure 6A:
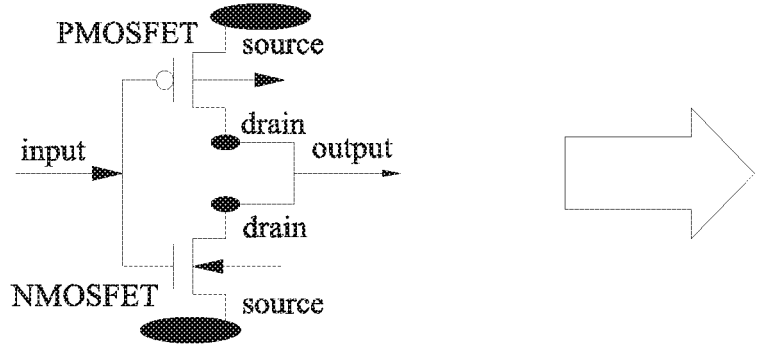
FIG. 6A illustrates circuit schematics of various logic gates according to some embodiments of the present disclosure.
Figure 6A:
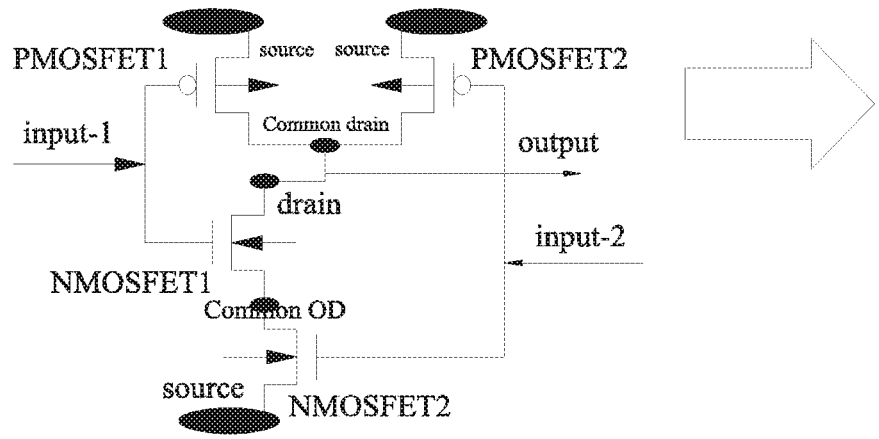
Figure 6A:
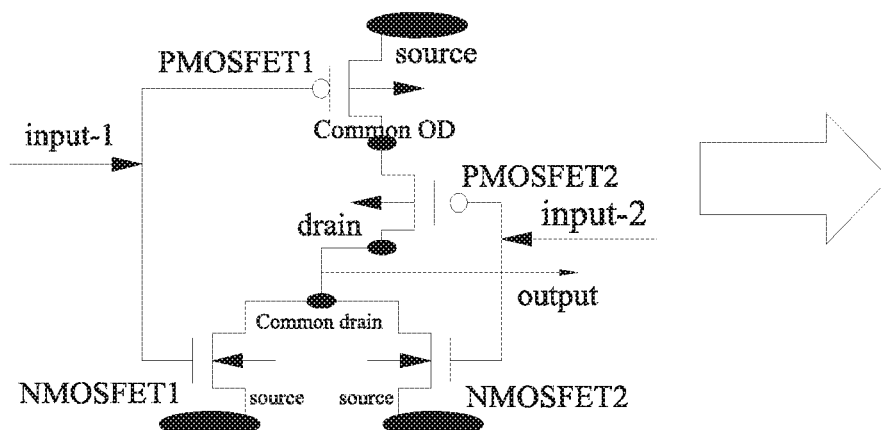
Figure 6B:
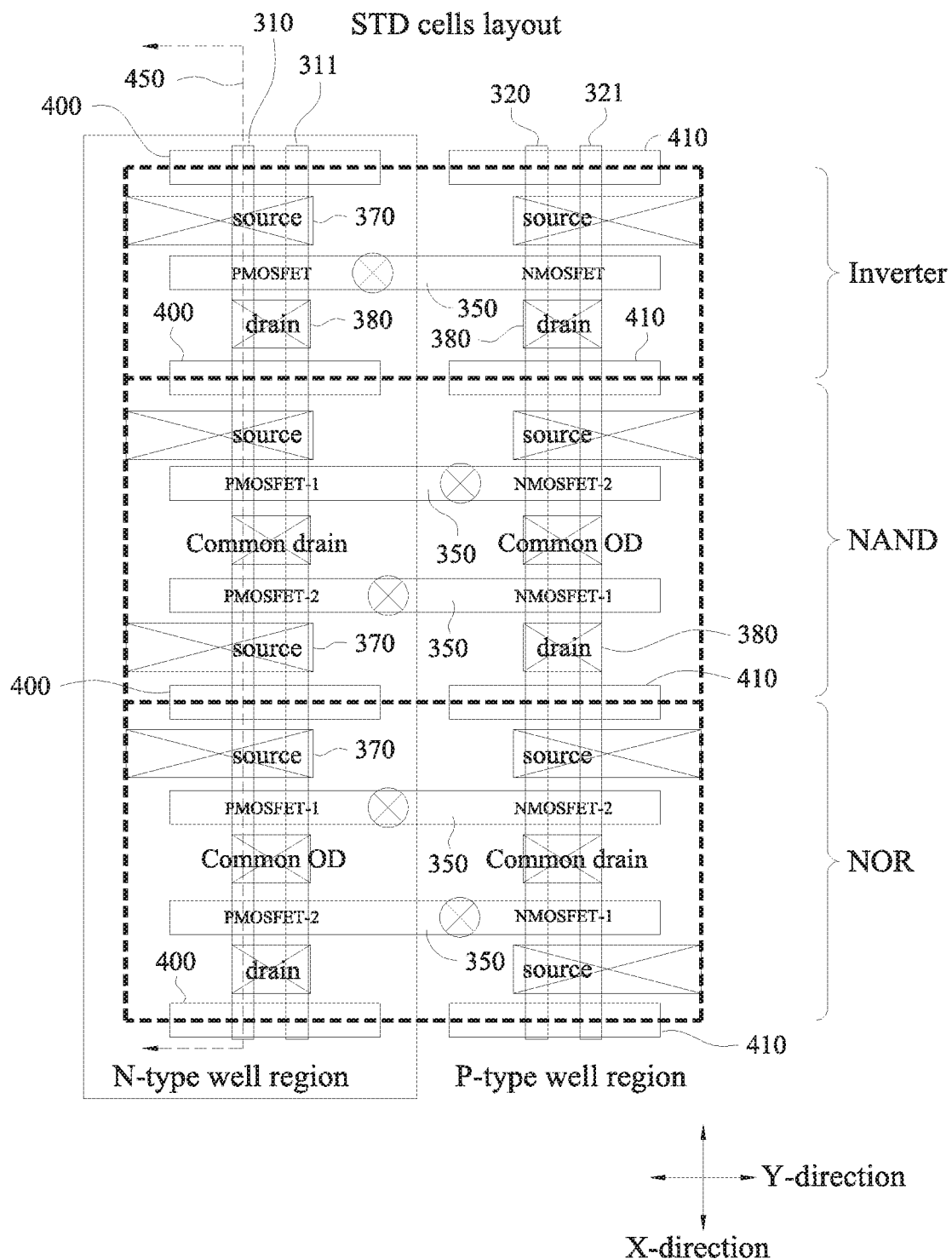
FIG. 6B illustrates the top view of the layout corresponding to the logic gates shown in FIG. 6A according to some embodiments of the present disclosure.
Figure 6C:
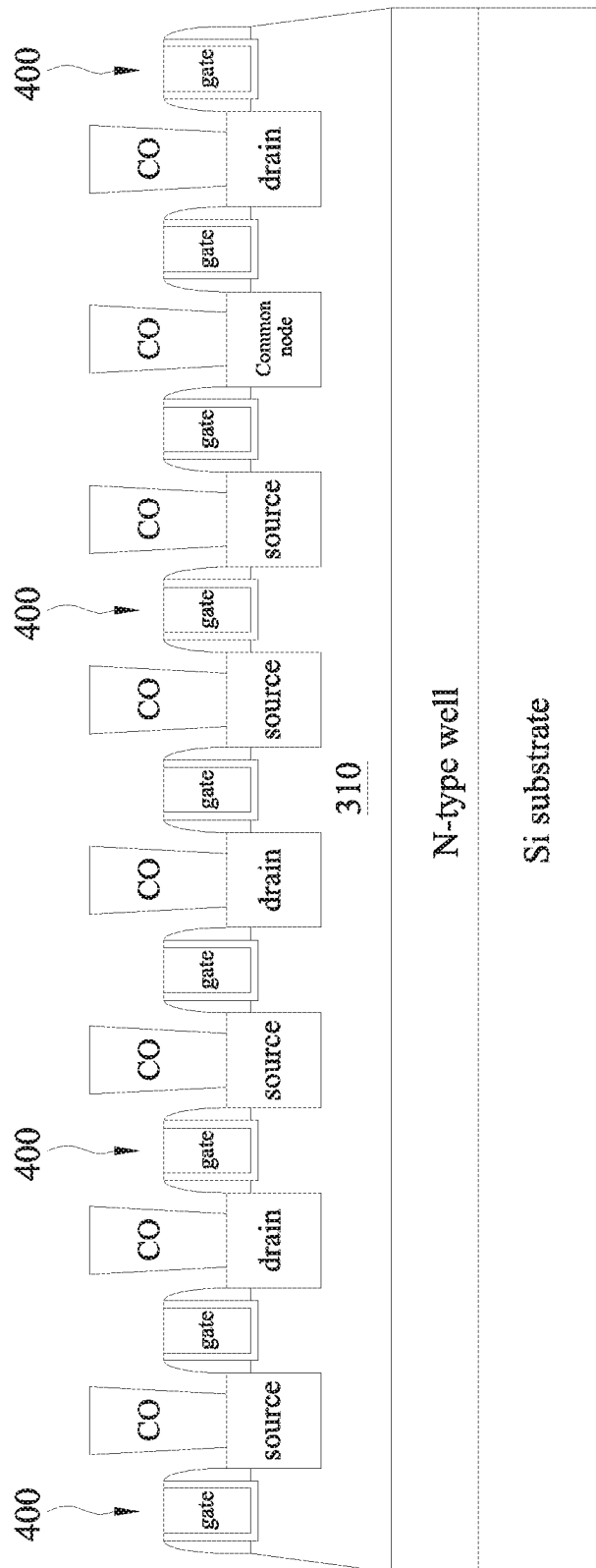
FIG. 6C illustrates a diagrammatic fragmentary cross-sectional view of the corresponding cells shown in FIG. 6B according to some embodiments of the present disclosure.

FIGS. 6A, 6B, 6C illustrate one or more standard cells according to some embodiments of the present disclosure. In more detail, FIG. 6A illustrates the circuit schematics of some common logic gates built using CMOS FinFETs, FIG. 6B illustrates the top view layout corresponding to these logic gates shown in FIGS. 6A, and 6C illustrates a diagrammatic fragmentary cross-sectional side view of the corresponding cells shown in FIG. 6B. It is understood that the top view layout shown in FIG. 6B may correspond to one or more of the STD cells (or portions thereof) shown in FIG. 2 or 4.

As examples, the logic gates shown in FIG. 6A includes an inverter gate, a NAND gate, and a NOR gate. The inverter gate, the NAND gate, and the NOR gate each include one or more N-type MOSFETs (NMOSFET) and one or more P-type MOSFETs (PMOSFETs). The particular type of logic gate is determined by coupling the gate, source, and drain of the NMOSFETs and PMOSFETs in a specific configuration as shown in FIGS. 6A-6B. The input terminal and output terminal of each logic gate is also labeled in FIG. 6A as such.

The top view layout of FIG. 6B illustrates PMOSFETs with an N-type well region and NMOSFETs with a P-type well region. A plurality of elongated fin lines 310-311 and 320-321 extend in an elongated manner in the X-direction. The fin lines 310-311 are parts of the PMOSFET, and the fin lines 320-321 as parts of the NMOSFET. The PMOSFET fin lines 310-311 are located over the N-type well region, whereas the NMOSFET fin lines 320-321 are located over the P-type well region.

As discussed above with reference to FIG. 1A, the fin lines 310-311 and 320-321 each include a channel region as well as source/drain regions located next to (e.g., on opposite sides of) the channel region. In the present embodiments, the PMOSFET fin lines 310-311 are comprised of a silicon germanium (SiGe) material (for strain effect enhancement), but the NMOSFET fin lines 320-321 are comprised of a non-germanium-containing semiconductor material, for example Si. The fin lines 310-311 and 320-321 are each continuous, for example they each extend across three or more abutted cells (abutted in the X-direction).

In each of the circuit cells (e.g., the inverter, NAND, or NOR), one or more CMOS gates 350 extend into both the N-type well region and the P-type well region in the Y-direction. The portion of the gate 350 located over the N-type well region forms the gate of the PMOSFET, and the portion of the gate 350 located over the P-type well region forms the gate of the NMOSFET. Each of the gates 350 wraps around the fin lines 310-311 and 320-321 in the manner described above with reference to FIG. 1A. For example, the gates 350 in the PMOSFET wrap around the fin lines 310-311, and the gates 350 in the NMOSFET wrap around the fin lines 320-321. The source/drain contacts (providing electrical connectivity to the source/drains of the FinFETs) are also illustrated in the top view layout of FIG. 6B, some examples of which are labeled herein as source contacts 370 and drain contacts 380. It is understood that silicide layers may be formed on the source/drain regions, and the source/drain contacts may be formed on the silicide layers.

According to the various aspects of the present disclosure, a plurality of isolation transistors is implemented between adjacent cells to provide electrical isolation between the adjacent circuit cells. In more detail, PMOSFET isolation transistors include gates 400, and the NMOSFET isolation transistors include gates 410. The gates 400-410 are each located on a border between two adjacent circuit cells, for example on the border between the inverter cell and the NAND cell, on the border between the NAND cell and the NOR cell, etc. The gates 400 of the PMOSFET isolation transistors are each tied to a voltage source Vdd, and the gates 410 of the NMOSFET isolation transistors are each tied to a voltage source Vss.

For the PMOSFET isolation transistors, their gates 400 wrap around the fin lines 310-311 having the SiGe channels. The source region of the PMOSFET isolation transistor is common with the P-type source/drain region of one of the PMOSFET transistors from the standard cells, and the drain region of the PMOSFET isolation transistor is common with the P-type source/drain region of another one of the PMOSFET transistors from the standard cells. Likewise, for the NMOSFET isolation transistors, their gates 410 wrap around the fin lines 320-321 having the Si channels. The source region of the NMOSFET isolation transistor is common with the N-type source/drain region of one of the NMOSFET transistors from the standard cells, and the drain region of the NMOSFET isolation transistor is common with the N-type source/drain region of another one of the NMOSFET transistors from the standard cells.

Due at least in part to their locations (e.g., the gates 410 being located on the circuit cell borders) and their electrical configuration (e.g., the gates 410 being electrically tied to Vdd), the PMOSFET isolation transistors provide electrical isolation between the adjacent circuit cells for the PMOSFET, for example between the inverter cell and the NAND cell, or between the NAND cell and the NOR cell. Similarly, the NMOSFET isolation transistors provide electrical isolation between the adjacent circuit cells for the NMOSFET, for example between the inverter cell and the NAND cell, or between the NAND cell and the NOR cell.

The cross-sectional side view of FIG. 6C is obtained by cutting along a cutline 450 in the N-type well region of the top view of the standard cells layout of FIG. 6B. As shown in FIG. 6C, the standard cell has an N-type well formed in a silicon substrate. The continuous fin line 310 is formed over the N-type well. A plurality of source and drain regions (including common node) is formed in the fin line 310, and plurality of gates is formed over the fin line 310. Some of these gates are the gates 400 of the isolation transistors discussed above. A plurality of contacts (CO) is formed over the source and drain regions to provide electrical connectivity thereto.

Figure 7A:
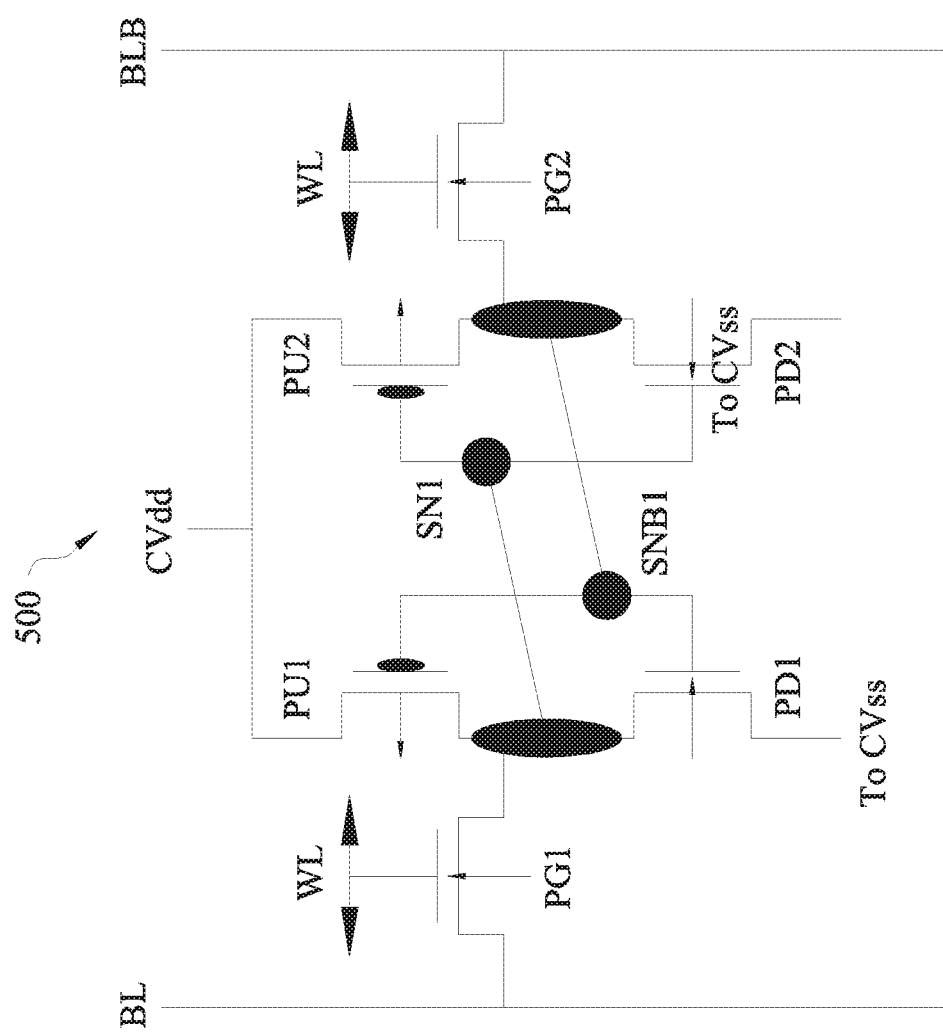
FIG. 7A illustrates a circuit schematic for a single-port SRAM cell according to embodiments of the present disclosure.
Figure 7B:
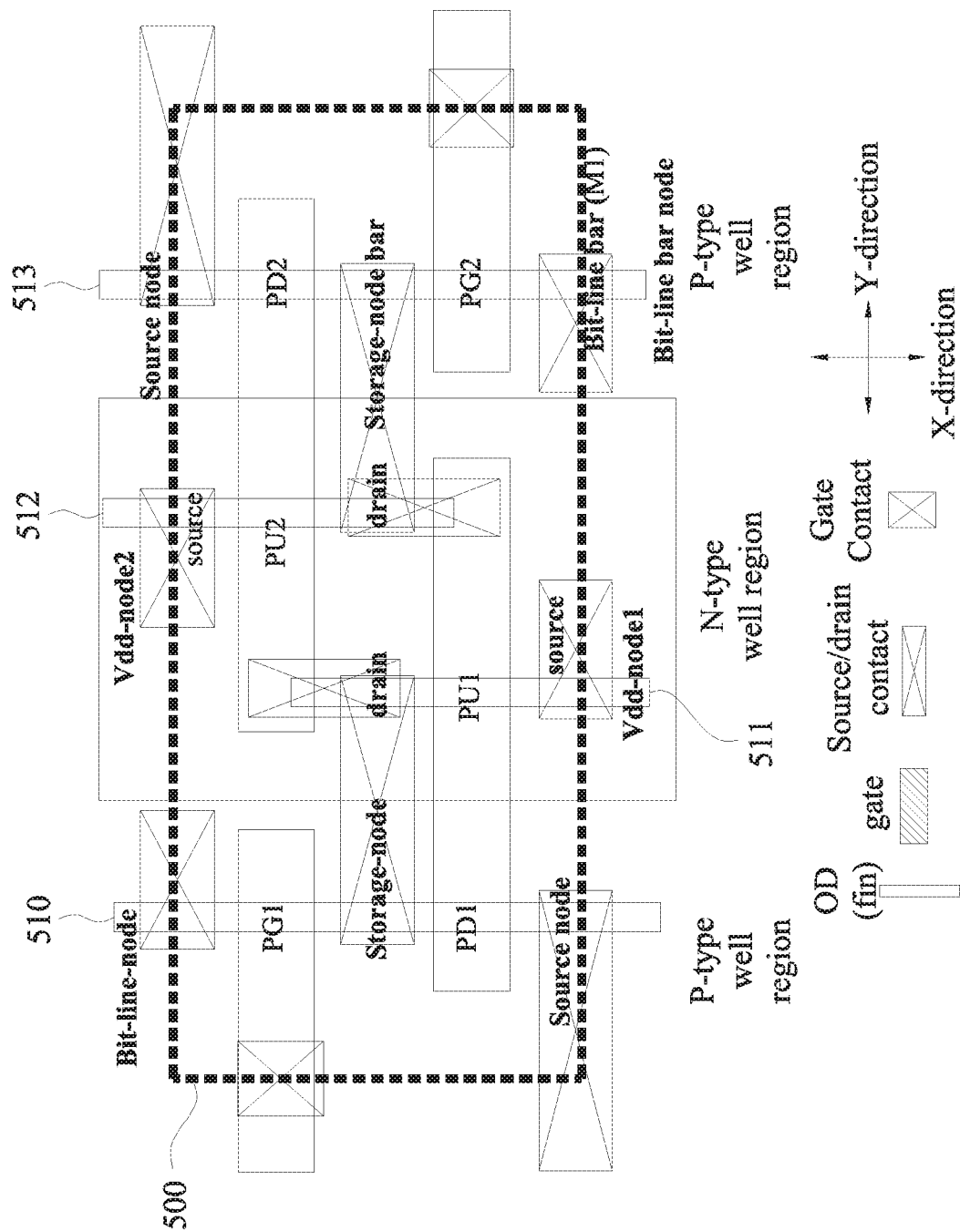
FIG. 7B illustrates the layout in a top view of the single-port SRAM cell shown in FIG. 7A according to embodiments of the present disclosure.

FIG. 7A illustrates a circuit schematic for a single-port SRAM cell 500, and FIG. 7B illustrates the corresponding layout in a top view of the single-port SRAM cell 500 according to embodiments of the present disclosure. The single-port SRAM cell 500 includes pull-up transistors PU1, PU2; pull-down transistors PD1, PD2; and pass-gate transistors PG1, PG2. As show in the circuit diagram, transistors PU1 and PU2 are p-type transistors, such as the p-type FinFETs discussed above, and transistors PG1, PG2, PD1, and PD2 are n-type FinFETs discussed above.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage CVdd, and the sources of the pull-down transistors PD1 and PD2 are coupled to a ground voltage CVss.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

As shown in the top view layout of FIG. 7B, the single-port SRAM cell 500 includes a plurality of fin lines 510-513 (also referred to as active region, or OD). The N-type fin lines 510 and 513 are comprised of a non-germanium-containing semiconductor material, for example silicon. The P-type fine lines 511-512 are comprised of silicon germanium for strain effect enhancement.

Similar to the SRAM cells discussed above with reference to FIG. 5, the fin lines 510 and 513 located over a P-type well region of the SRAM cell 500 extend continuously in the X-direction, whereas the fin lines 511 and 512 located over an N-type well region of the SRAM cell 500 extend discontinuously in the X-direction. In other words, the fin line 511 and the fin line 512 each extend partially into, but not completely through, the SRAM cell 500. According to the embodiment shown in FIG. 7B, the fin line 511 extends into the SRAM cell 500 from the "bottom" of the SRAM cell 500, and it terminates into the SRAM cell 500 on the drain side of the pull-up transistor PU1. The fin line 512 extends into the SRAM cell 500 from the "top" of the SRAM cell 500, and it terminates into the SRAM cell 500 on the drain side of the pull-up transistor PU2. This type of configuration helps prevent the data node leakage between the drain nodes of adjacent pull-up transistors.

Figure 8A:
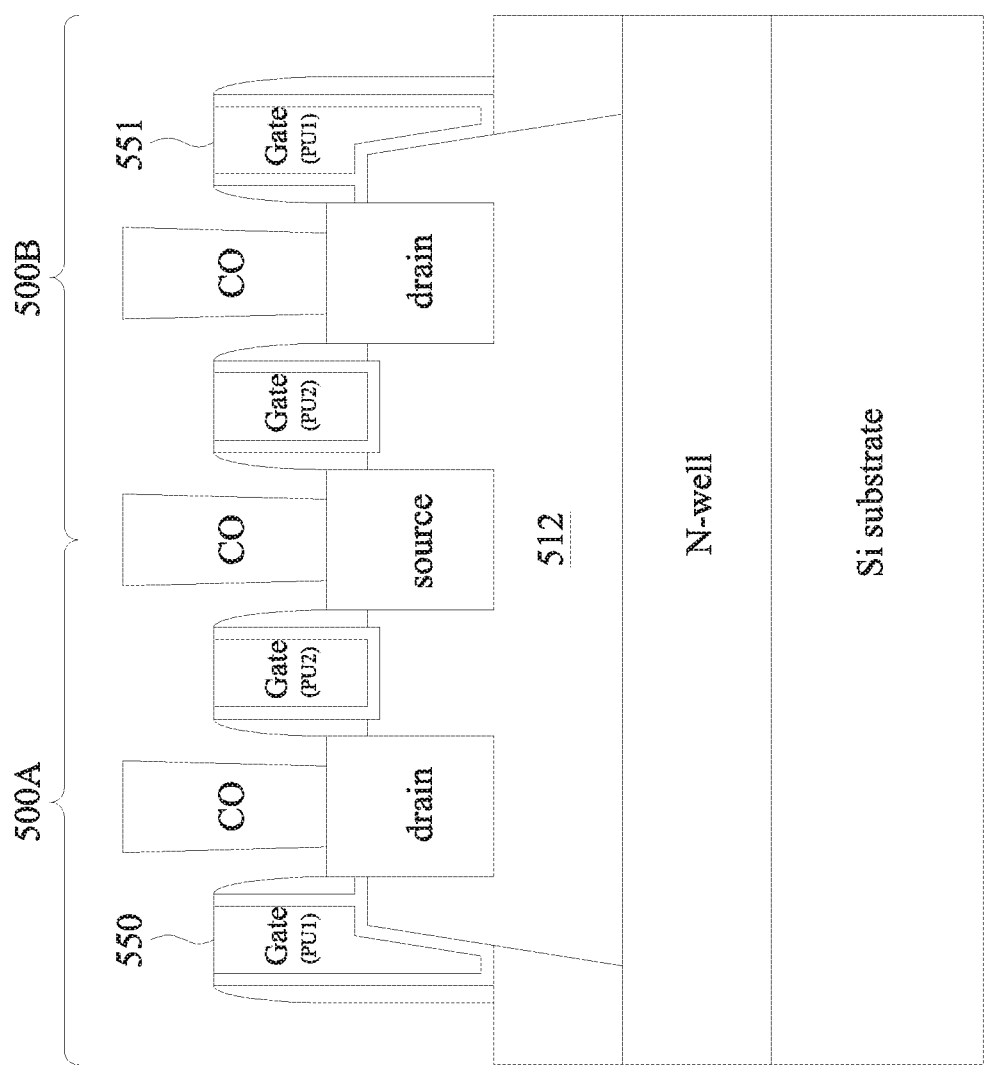
FIG. 8A illustrates a cross-sectional side view of two abutting SRAM cells according to embodiments of the present disclosure.
Figure 8B:
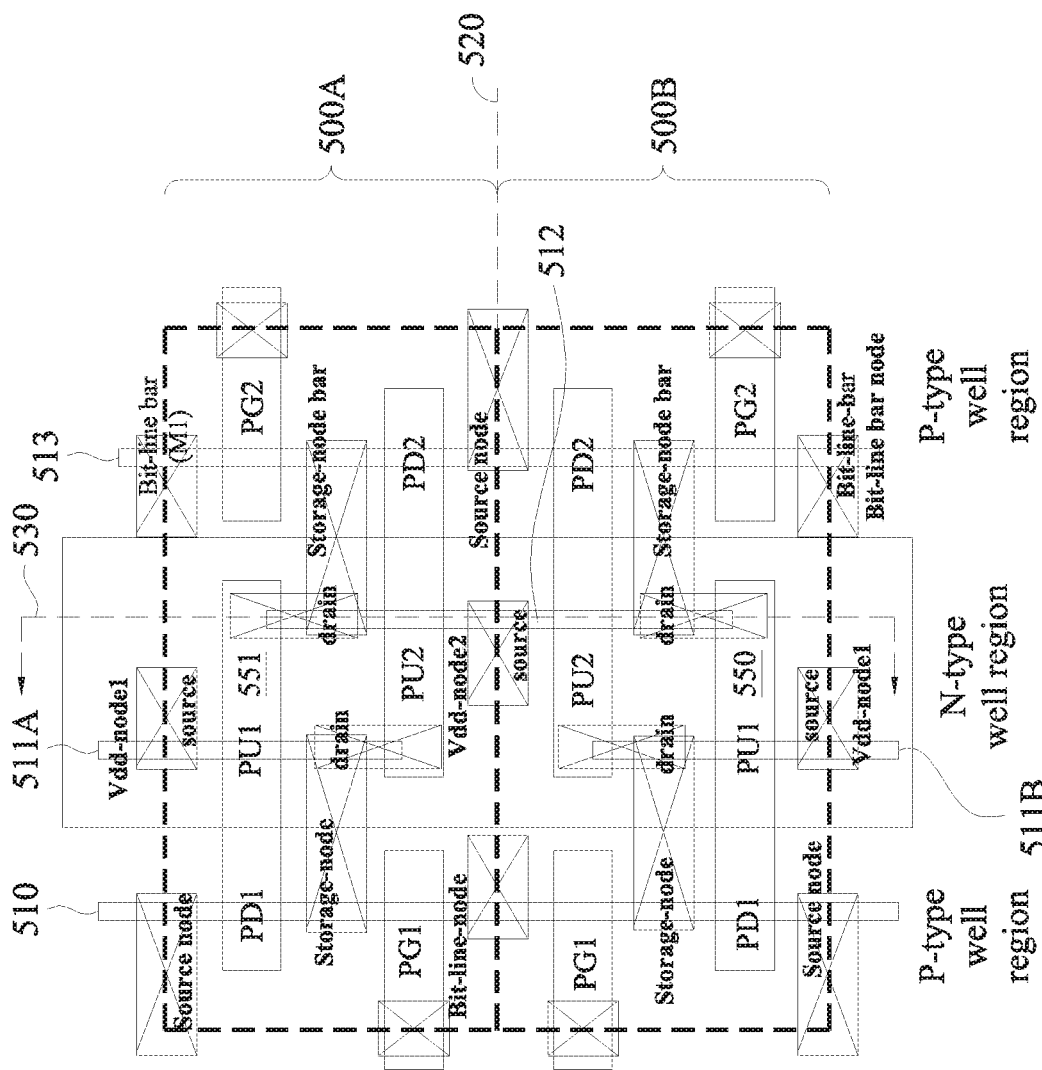
FIG. 8B illustrates the layout of the two abutting SRAM cells of FIG. 8A in a top view according to embodiments of the present disclosure.

FIG. 8A illustrates a cross-sectional side view of two abutting SRAM cells 500A-500B, and FIG. 8B illustrates the corresponding layout of the two abutting SRAM cells 500A-500B in a top view according to embodiments of the present disclosure. The SRAM cells 500A and 500B are each configured the same as the SRAM cell 500 in FIGS. 7A-7B. In FIG. 8B, the SRAM cell 500A is "flipped upside down" and joined with the SRAM cell 500B, which is not flipped. In other words, the SRAM cells 500A and 500B are symmetrically disposed around an axis 520.

As discussed above with reference to FIG. 7B, the NMOSFET fin lines 510 and 513 (located over the P-type well region) extend continuously through at least the two SRAM cells 500A-500B. In comparison, the SRAM cells 500A-500B have discontinuous PMOSFET fin lines. For example, the fin lines 511A-511B and 512 are PMOSFET fin lines located over the N-type well region and have the SiGe content. The fin line 511A extends partially into the SRAM cell 500A but does not extend into the SRAM cell 500B, the fin line 512 extends partially (but not completely) into both the SRAM cells 500A and 500B, and the fin line 511B extends partially into the SRAM cell 500B but does not extend into the SRAM cell 500A. The fin lines 511A, 512, and 511B are also not connected to one another. The discontinuous fine lines 511A-511B and 512 each end in the drain side of the pull up transistors PU1 or PU2. As discussed above with reference to FIG. 7B, this type of broken fin line layout is used herein to prevent or reduce data node leakage between the pull up transistor drain node of one SRAM cell 500A and the pull up transistor drain node of an adjacent SRAM cell 500B.

The cross-sectional side view shown in FIG. 8A is obtained by cutting the top view of FIG. 8B along a cutline 530. Due to the location of the cutline 530, the fin line 512 is shown in the cross-sectional view of FIG. 8A. The fin line 512 is located over an N well, which is formed in/over a substrate. Source and drain regions are formed in the fin line 512, and gates for the pull up transistors PU1 and PU2 are formed over the fin line 512. Contacts (CO) are formed over the source and drain regions to provide electrical connectivity thereto. The discontinuous nature of the PMOSFET fin lines is manifested in FIG. 8A as the fin line 512 not extending fully laterally, for example not extending fully below the gates 550 and 551. Also as shown in FIG. 8A, both ends of the fin line 512 terminate on their respective sides of the drains.

Figure 9B:
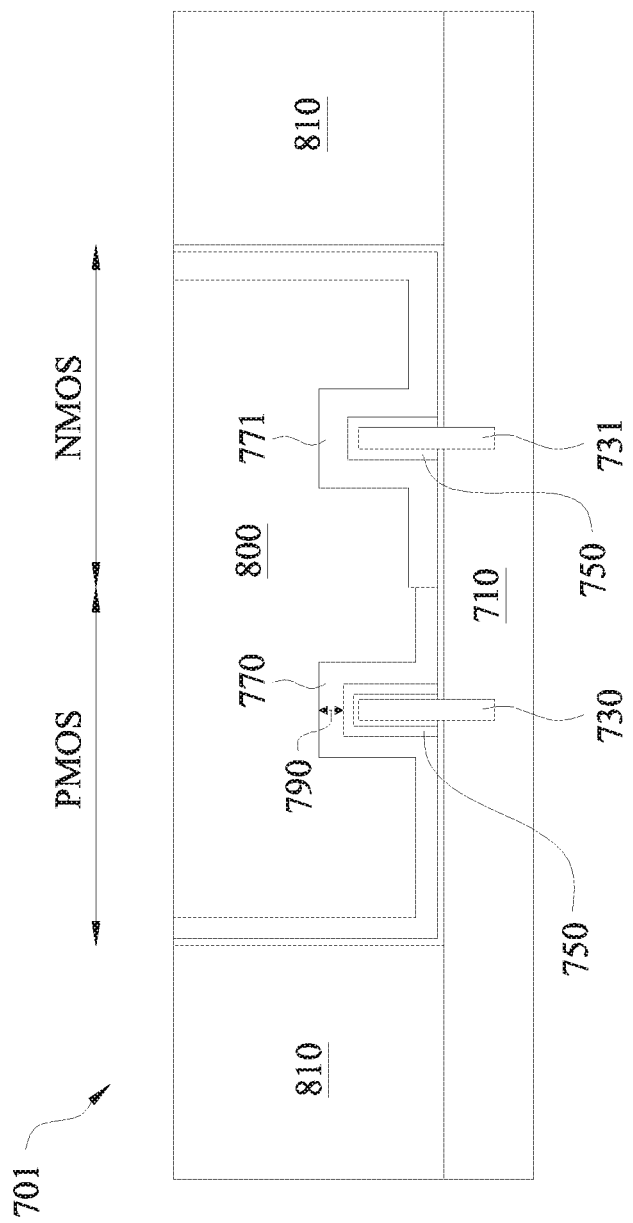
FIG. 9B is a diagrammatic fragmentary cross-sectional side view of a portion of a CMOSFET device in an SRAM cell according to embodiments of the present disclosure.

Another aspect of the present disclosure involves multiple work-function metals for the standard cells and the SRAM cells. This is illustrated in more detail in FIGS. 9A and 9B, where FIG. 9A is a diagrammatic fragmentary cross-sectional side view of a portion of a CMOSFET device 700 in a standard cell (e.g., as a part of the standard cells array 100 discussed above), and FIG. 9B is a diagrammatic fragmentary cross-sectional side view of a portion of a CMOSFET device 701 in an SRAM cell (e.g., as a part of the SRAM cells array 200 discussed above). It is understood that the cross-sectional side views of FIGS. 9A and 9B are obtained by cutting along the Y-direction in FIG. 1A. The PMOS and NMOS sections of the CMOSFET devices 700-701 are labeled in FIGS. 9A and 9B.

The CMOSFET devices 700-701 each include a dielectric isolation structure 710, for example shallow trench isolation (STI). The STD cell CMOSFET device 700 includes fin structures 720 and 721 that protrude vertically (e.g., in the Z-direction of FIG. 1A) out of the dielectric isolation structure 710. The fin structure 720 is a part of the PMOS of the STD cell CMOSFET device 700, and the fin structure 721 is a part of the NMOS of the STD cell CMOSFET device 700. The SRAM cell CMOSFET device 701 includes fin structures 730 and 731 that protrude vertically (e.g., in the Z-direction of FIG. 1A) out of the dielectric isolation structure 710. The fin structure 730 is a part of the PMOS of the SRAM cell CMOSFET device 701, and the fin structure 731 is a part of the NMOS of the SRAM cell CMOSFET device 701. As discussed above, the fin structures 720 and 730 for the PMOS comprise silicon germanium (SiGe), whereas the fin structures 721 and 731 for the NMOS comprise a non-germanium-containing semiconductor material, such as silicon (Si). The channel regions of the CMOSFET devices 700 and 701 are formed in the fin structures 720-721 and 730-731.

The CMOSFET device 700 includes a gate dielectric layer 740 that is formed over the dielectric isolation structure 710 and over the fin structures 720-721, and the CMOSFET device 701 includes a gate dielectric layer 750 that is formed over the dielectric isolation structure 710 and over the fin structures 730-731. In some embodiments, the gate dielectric layers 740 and 750 includes silicon oxynitride, silicon nitride, or silicon oxide. In other embodiments, the gate dielectric layer 740 and 750 includes a high-k dielectric material, which is a material having a dielectric constant that is greater than a dielectric constant of SiO2. In an embodiment, the high-k gate dielectric material includes hafnium oxide (HfO2), which has a dielectric constant that is in a range from approximately 18 to approximately 40. In alternative embodiments, the high-k gate dielectric material may include ZrO2, $Y_2O_3$, La2O5, Gd2O5, TiO2, Ta2O5, HfErO, HfLaO, HfYO, HfGdO, HfAlO, HfZrO, HfTiO, HfTaO, or SrTiO.

A P-type work function metal layer 760 is formed over the gate dielectric layer 740 in the PMOS region of the CMOSFET device 700, and an N-type work function metal layer 761 is formed over the gate dielectric layer 740 in the NMOS region of the CMOSFET device 700. Meanwhile, a P-type work function metal layer 770 is formed over the gate dielectric layer 750 in the PMOS region of the CMOSFET device 701, and an N-type work function metal layer 771 is formed over the gate dielectric layer 750 in the NMOS region of the CMOSFET device 701.

In some embodiments, the P-type work function metal layers 760 and 770 each comprise a metal material that is titanium nitride (TiN) or tantalum nitride (TaN). It is understood that additional metal layers may be stacked upon the P-type work function metal layers 760 and 770. In some embodiments, the N-type work function metal layers 761 and 771 each comprise a metal material that is titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), or tantalum carbon nitride (TaCN).

Also as shown in FIGS. 9A and 9B, the P-type work function metal layer 760 has a thickness 780, and the P-type work function metal layer 770 has a thickness 790. In some embodiments, the thickness 780 is greater than the thickness 790. In some embodiments, the thickness 790 is in a range between about 5 angstroms and about 80 angstroms, and the thickness 780 is in a range between about 5 angstroms and about 30 angstroms. This thickness difference results in the P-type work function metal layer 760 having a lower threshold voltage Vt than the P-type work function metal layer 770. In some embodiments, the threshold voltage Vt associated with the P-type work function metal layer 760 is 50 mV to 200 mV smaller than the threshold voltage Vt associated with the P-type work function metal layer 770.

In some embodiments, the N-type work function metal layer 761 has a lower threshold voltage Vt than the N-type work function metal layer 771. This lower threshold voltage Vt is achieved by configuring the work function layers 761 and 771. For example, the work function metal layer 761 may have a higher aluminum content (e.g., in the TaAl or TiAl compound) than the work function metal layer 771. In some embodiments, the aluminum concentration for both the layer 761 and 771 is in a range between about 2% and about 50%, though it is understood that the aluminum concentration is still higher for the layer 761 than the layer 771. In some embodiments, by configuring the aluminum content differently for the work function metal layers 761 and 771, the threshold voltage Vt associated with the N-type work function metal layer 761 is 50 mV to 200 mV smaller than the threshold voltage Vt associated with the N-type work function metal layer 771. As such, the SRAM CMOSFET has higher threshold voltage Vt than the logic circuit CMOSFET (for both the PMOS and the NMOS). This is desired because the SRAM cells typically require a higher threshold voltage Vt than the standard logic circuit cells.

A fill metal 800 is also formed over the work function metals 760-761 and 770-771. The fill metal 800 serves as the main conductive portion of the gate electrode. In some embodiments, the fill metal 800 comprises tungsten (W). In other embodiments, the fill metal 800 comprises aluminum (Al). The work function metal layers 760-761 and 770-771 and the fill metal 800 collectively constitute the metal gate electrode for the CMOSFET. A dielectric layer 810 also surrounds the metal gate electrode. In some embodiments, the dielectric layer 810 comprises a low-k dielectric material.

Figure 10:
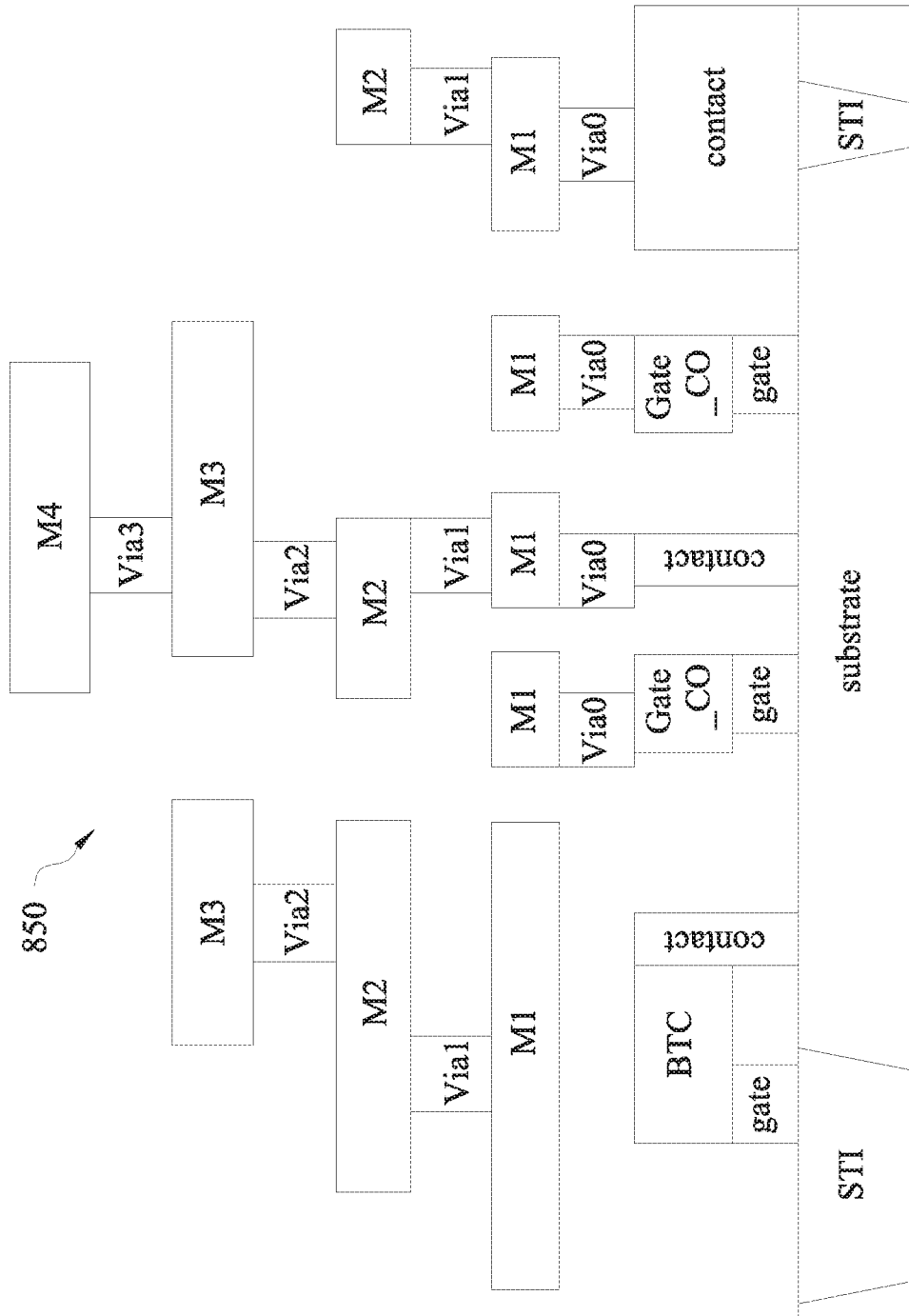
FIG. 10 is a diagrammatic fragmentary cross-sectional side view of a portion of an interconnect structure according to embodiments of the present disclosure.

FIG. 10 is a diagrammatic fragmentary cross-sectional side view of a portion of an interconnect structure 850 according to embodiments of the present disclosure. The interconnect structure 850 may be used to interconnect the elements of the standard cells or the SRAM cells discussed above. As illustrated in FIG. 10, the interconnect structure 850 includes a plurality of metal layers, for example metal layers M1, M2, M3, and M4. Isolation structures such as shallow trench isolation (STI) are formed in the substrate. A plurality of gates is formed over the substrate. Conductive contacts (CO) are formed over the substrate and over the gates. Some of these contacts are butted contacts (BTC). A plurality of vias (such as via0, via1, via2, via3) provide electrical connectivity between the metal layers and the gates (and other components such as source/drain).

Figure 11:
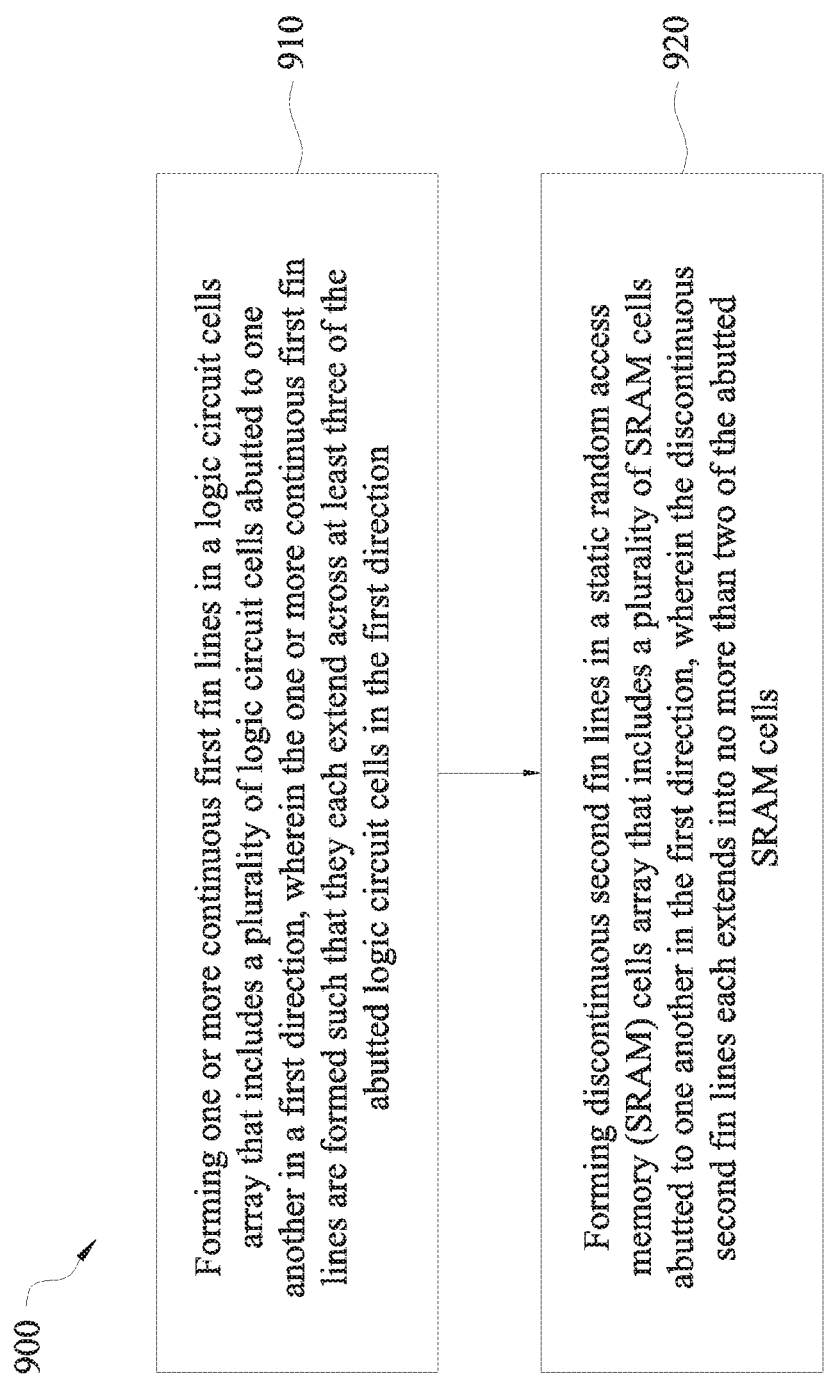
FIG. 11 is a flowchart illustrating a method according to an embodiment of the present disclosure.

FIG. 11 is a flowchart illustrating a method 900 according to an embodiment of the present disclosure. The method 900 includes a step 910, in which one or more continuous first fin lines are formed in a logic circuit cells array that includes a plurality of logic circuit cells abutted to one another in a first direction. The one or more continuous first fin lines are formed such that they each extend across at least three of the abutted logic circuit cells in the first direction.

The method 900 includes a step 920, in which discontinuous second fin lines are formed in a static random access memory (SRAM) cells array that includes a plurality of SRAM cells abutted to one another in the first direction. The discontinuous second fin lines each extends into no more than two of the abutted SRAM cells.

In some embodiments, each of the discontinuous second fin lines extends across no more than two of the abutted SRAM cells in the first direction.

In some embodiments, the discontinuous second fin lines include at least: a first segment that extends partially into a first SRAM cell and a second SRAM cell abutted to the first SRAM cell; a second segment that extends partially into the second SRAM cell and a third SRAM cell abutted to the second SRAM cell; and a third segment that extends partially into the third SRAM cell and a fourth SRAM cell abutted to the third SRAM cell. In some embodiments, the first segment is separated from the third segment in the first direction by a first gap, the second segment is separated from the first segment or the third segment in a second direction by a second gap, the second direction being different from the first direction, and the first gap extends across a boundary between the second SRAM cell and the third SRAM cell.

In some embodiments, the SRAM cells array includes PMOSFETs and NMOSFETs; and the discontinuous second fin lines are fin lines for the PMOSFETs. In some embodiments, the SRAM cells array further includes one or more continuous third fin lines for the NMOSFETs. In some embodiments, each of the continuous third fin lines extends across at least three of the abutted SRAM cells in the first direction. In some embodiments, the discontinuous second fin lines each comprise silicon germanium; and the continuous third fin lines each comprise a non-germanium-containing semiconductor material.

In some embodiments, each of the SRAM cells includes a pull-up transistor; and each of the discontinuous second fin lines terminates in a drain of the pull-up transistor.

In some embodiments, the logic circuit cells array further includes one or more isolation transistors each located between two respective abutted logic circuit cells; and each of the isolation transistors is configured to provide electrical isolation between the two respective abutted circuit cells. In some embodiments, the isolation transistors include a PMOSFET isolation transistor and an NMOSFET isolation transistor; a gate of the PMOSFET isolation transistor is electrically tied to a Vdd voltage source; and a gate of the NMOSFET isolation transistor is electrically tied to a Vss ground. In some embodiments, each of the isolation transistors includes a respective gate that is located at a respective border between two abutted logic circuit cells.

In some embodiments, the logic circuit cells array and the SRAM cells array each include an NMOSFET and a PMOSFET; a gate of the PMOSFET of the logic circuit cells array includes a first work function metal; a gate of the PMOSFET of the SRAM cells array includes a second work function metal; a gate of the NMOSFET of the logic circuit cells array includes a third work function metal; a gate of the NMOSFET of the SRAM cells array includes a fourth work function metal; and at least one of the first, second, third, and fourth work function metals is different from a rest of the first, second, third, and fourth work function metals. In some embodiments, the first work function metal is thicker than the second work function metal. In some embodiments, the third work function metal has a greater aluminum content than the fourth work function metal.

It is understood that additional processes may be performed before, during, or after the steps 910-920 of the method 900. For reasons of simplicity, these additional steps are not discussed herein in detail.

Based on the above discussions, it can be seen that the present disclosure offers advantages over conventional FinFET SRAM devices. It is understood, however, that other embodiments may offer additional advantages, and not all advantages are necessarily disclosed herein, and that no particular advantage is required for all embodiments. One advantage is that the discontinuous PMOS fin lines for the SRAM reduces the strain effect, which suppresses the $I_{on}$ current. The reduction of the $I_{on}$ current improves SRAM write margins. Meanwhile, the fin lines for the logic circuit cells are continuous. The continuous fin lines entail faster chip speed. Another advantage is that the isolation transistors are implemented to provide electrical isolation between adjacent cells. Yet another advantage is that multiple work function metals are implemented for the logic circuit cells and the SRAM cells. The content and/or thicknesses of the work function metals are configured such that the SRAM MOSFETs have a greater threshold voltage Vt than the logic circuit MOSFETs, which is also desired. Other advantages include compatibility with existing fabrication process flow and ease of implementation.

One aspect of the present disclosure pertains to an IC chip. The IC chip includes a logic circuit cells array and a static random access memory (SRAM) cells array. The logic circuit cells array includes a plurality of logic circuit cells abutted to one another in a first direction. The logic circuit cells array includes one or more continuous first fin lines that each extends across at least three of the abutted logic circuit cells in the first direction. The static random access memory (SRAM) cells array includes a plurality of SRAM cells abutted to one another in the first direction. The SRAM cells array includes discontinuous second fin lines.

Another aspect of the present disclosure pertains to a semiconductor device. A plurality of logic circuit cells are adjacently disposed to one another in a first direction. A first fin line extends continuously across at least three of the logic circuit cells in the first direction. A plurality of static random access memory (SRAM) cells are adjacently disposed to one another in the first direction. A plurality of second fin lines each extend into no more than two of the SRAM cells. The second fin lines are disjointed with one another. The second fin lines are PMOS fin lines. The second fin lines each comprise silicon germanium.

Yet another aspect of the present disclosure pertains to a method. One or more continuous first fin lines are formed in a logic circuit cells array that includes a plurality of logic circuit cells abutted to one another in a first direction. The one or more continuous first fin lines are formed such that they each extend across at least three of the abutted logic circuit cells in the first direction. Discontinuous second fin lines are formed in a static random access memory (SRAM) cells array that includes a plurality of SRAM cells abutted to one another in the first direction. The discontinuous second fin lines each extend into no more than two of the abutted SRAM cells.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A device, comprising:
   a static random access memory (SRAM) cells array that includes: a first type well, a second type well disposed adjacent to the first type well in a first direction, a plurality of elongated first fin structures that each extend in a second direction, wherein the first fin structures are disposed over the first type well; and
   a non-SRAM cells array that includes a plurality of elongated second fin structures that each extend in the second direction, wherein the second fin structures each have a substantially longer dimension in the second direction than each of the first fin structures.

2. The device of claim 1, wherein the SRAM cells array further includes a plurality of elongated third fin structures that are disposed over the second type well.

3. The device of claim 2, wherein the third fin structures each have a substantially longer dimension in the second direction than each of the first fin structures.

4. The device of claim 3, wherein:
the first fin structures each extend over no more than two SRAM cells; and
the third fin structures each extend over at least three SRAM cells.

5. The device of claim 1, wherein:
the first type well includes an n-type well;
the second type well includes a p-type well; and
the first fin structures are each disposed over the n-type well but not over the p-type well.

6. The device of claim 5, wherein the SRAM cells array is free of having any fin structures that are disposed over the p-type well.

7. The device of claim 1, wherein the non-SRAM cells array include a logic cells array.

8. The device of claim 1, wherein:
the non-SRAM cells array includes a third type well and a fourth type well;
a first subset of the second fin structures are disposed over the third type well; and
a second subset of the second fin structures are disposed over the fourth type well.

9. The device of claim 1, wherein:
the non-SRAM cells array includes a plurality of non-SRAM cells that are arranged into a column;
the non-SRAM cells array includes a plurality of isolation transistors; and
gate structures of the isolation transistors are located at borders between the non-SRAM cells.

10. The device of claim 1, wherein:
the SRAM cells array includes a plurality of SRAM cells that are arranged into a column;
the first fin structures are separated from one another in the second direction by a plurality of gaps; and
the gaps are disposed over borders between the SRAM cells.

11. A device, comprising:
a plurality of static random access memory (SRAM) cells that are arranged into a first column that extends in a first direction in a top view; and
a plurality of non-SRAM cells that are arranged into a second column that extends in the first direction in the top view;
wherein:
the SRAM cells include a plurality of first fin structures that each extends partially through two of the SRAM cells in the top view; and
the non-SRAM cells include a plurality of second fin structures that each extends through three or more of the non-SRAM cells in the top view.

12. The device of claim 11, wherein the second fin structures are each substantially longer in the first direction than each of the first fin structures.

13. The device of claim 11, wherein:
the SRAM cells further include a plurality of third fin structures that each extends through three or more of the SRAM cells in the top view; and
the third fin structures are spaced apart from the first or second fin structures in a second direction perpendicular to the first direction.

14. The device of claim 13, wherein:
the SRAM cells include an n-type well and a p-type well;
the first fin structures are each disposed over the n-type well; and
the third fin structures are each disposed over the p-type well.

15. The device of claim 11, wherein:
the SRAM cells include an n-type well and a p-type well;
the first fin structures are each disposed over the n-type well; and
no fin structures are disposed over the p-type well.

16. The device of claim 11, wherein the non-SRAM cells include a plurality of logic circuits and a plurality of isolation transistors that provide electrical isolation between adjacent ones of the non-SRAM cells.

17. The device of claim 11, wherein:
the non-SRAM cells include an n-type well and a p-type well;
a first group of the second fin structures are formed over the n-type well; and
a second group of the second fin structures are formed over the p-type well.

18. The device of claim 11, wherein:
the non-SRAM cells include an n-type well and a p-type well; and
none of the second fin structures is formed over the p-type well.

19. A device, comprising:
a static random access memory (SRAM) that includes pull-up (PU) transistors, pass-gate (PG) transistors, and pull-down (PD) transistors, wherein: the PU transistors include a plurality of first fin structures, the PG transistors or the PD transistors includes a plurality of second fin structures; and
a plurality of non-SRAM that include a plurality of third fin structures;
wherein:
the PU transistors include a plurality of first fin structures;
the PG transistors or the PD transistors includes a plurality of second fin structures that are substantially longer than the first fin structures; and
the third fin structures are substantially longer than the first fin structures.

20. The device of claim 19, wherein:
the non-SRAM includes a plurality of non-SRAM cells and a plurality of isolation transistors; and
gate structures of the isolation transistors are located at boundaries between adjacent ones of the non-SRAM cells.

* * * * *